United States Patent [19]

Wada et al.

[11] 4,394,191

[45] Jul. 19, 1983

[54] STACKED POLYCRYSTALLINE SILICON FILM OF HIGH AND LOW CONDUCTIVITY LAYERS

[75] Inventors: Yasuo Wada, Tokyo; Hiroo Usui, Machida; Makoto Ohkura, Hachioji; Masanobu Miyao; Masao Tamura, both of Tokorozawa; Takashi Tokuyama, Higashikurume, all of Japan

[73] Assignee: Hitachi, Ltd., Tokyo, Japan

[21] Appl. No.: 217,224

[22] Filed: Dec. 17, 1980

[30] Foreign Application Priority Data

Dec. 17, 1979 [JP] Japan ............................... 54-162760

[51] Int. Cl.³ ...................... H01L 21/263; B05D 3/06
[52] U.S. Cl. ..................................... 148/33.1; 148/1.5; 148/187; 357/59; 357/91
[58] Field of Search ....................... 148/1.5, 33.1–33.4, 148/187; 357/59, 91

[56] References Cited

U.S. PATENT DOCUMENTS

| | | | |
|---|---|---|---|
| 3,365,371 | 1/1975 | Imai et al. | 148/188 |
| 3,892,606 | 7/1975 | Chappelow et al. | 148/174 |
| 4,087,571 | 5/1978 | Kamins | 148/1.5 |
| 4,109,273 | 8/1978 | Glasl | 357/35 |
| 4,146,906 | 3/1979 | Miyata | 357/59 |
| 4,198,246 | 4/1980 | Wu | 148/1.5 |
| 4,214,918 | 7/1980 | Gat et al. | 148/1.5 |
| 4,229,502 | 10/1980 | Wu | 427/82 |
| 4,249,968 | 2/1981 | Gardiner et al. | 148/174 |
| 4,309,224 | 1/1982 | Shibata | 148/1.5 |

OTHER PUBLICATIONS

Chou et al., IBM-TDB, 13 (1970), 1485.
Wu et al., Appl. Phys. Letts. 34 (1979), 737.
Gat et al., Appl. Phys. Letts. 33 (1978), 775.
White et al., Jour. Appl. Phys. 50 (1979), 3261.
Cohen et al., Appl. Phys. Letts. 33 (1978), 751.
Sealy, B. J., Jour. Crystal Growth 48 (1979), 655.

*Primary Examiner*—Upendra Roy
*Attorney, Agent, or Firm*—Antonelli, Terry & Wands

[57] ABSTRACT

A polycrystalline silicon film is implanted with an impurity in large amounts and is heated to be annealed, whereupon it is irradiated with a laser beam to be annealed.

Thus, a polycrystalline silicon film of very low resistivity consisting of a second layer whose activated impurity concentration is equal to or below a solid solubility and a first layer whose activated impurity concentration is above the solid solubility is formed.

10 Claims, 2 Drawing Figures

STACKED POLYCRYSTALLINE SILICON FILM OF HIGH AND LOW CONDUCTIVITY LAYERS

BACKGROUND OF THE INVENTION

1. Field of the Invention

This invention relates to a polycrystalline silicon film and a method of manufacturing the same. More particularly, it relates to a polycrystalline silicon film of low resistance for use in, for example, the interconnections and gate electrodes of a MOS integrated circuit (IC), etc., and a method of manufacturing the same.

2. Description of the Prior Art

Polycrystalline silicon films for use in, e.g., the interconnections of various semiconductor integrated circuits and the gate electrodes of MOS·ICs should desirably have the lowest possible resistances in order to enhance the performances of the ICs etc.

In reducing the resistance of a polycrystalline silicon film, it is common practice to employ a method in which the polycrystalline silicon film is doped with an impurity such as phosphorus, arsenic and boron by thermal diffusion, ion implantation or the like.

With the prior-art impurity-doping method resorting to thermal diffusion, ion implantation or the like, however, the resistivity of the polycrystalline silicon cannot be made below approximately $4\times10^{-4}\Omega\cdot cm$ because the maximum concentration of the impurity to be activated in the silicon is determined by a thermodynamical solid solubility.

More specifically, although it is possible to introduce the impurity into the polycrystalline silicon film in large amounts by, for example, ion implantation, the quantity of the impurity which can enter the crystal lattice points of the polycrystalline silicon film is determined in dependence on the temperature. Therefore, when after the ion implantation the polycrystalline silicon film is annealed at a high temperature in order to remove the distortion of the crystal having occurred due to the ion implantation, the situation as to quantity of the impurity is as follows. While the polycrystalline silicon film is at high temperatures, the impurity atoms in very large amounts enter the crystal lattice points. However, as the temperature lowers, the impurity atoms are gradually released from the crystal lattice points. At last, only that quantity of the impurity which is governed by the solid solubility remains in the crystal lattice points.

The resistivity of the polycrystalline silicon film is determined by the quantity of the impurity existing in the crystal lattice points (activated impurity atoms).

Accordingly, even when very large amounts of impurity atoms are introduced by the ion implantation, the quantity of the impurity atoms which can enter the crystal lattice points cannot be increased for the reason described above. It has therefore been extremely difficult to lower the resistivity. Moreover, when semiconductor devices are mass-produced in a factory, the attained resistivities of polycrystalline silicon films are still higher. This has also been a serious problem in practical use.

In order to employ a polycrystalline silicon film in various usages such as the interconnections and gate electrodes of multifarious ICs having high densities of integration, the resistivity of the polycrystalline silicon film needs to be made below approximately $4\times10^{-4}\Omega\cdot cm$. To this end, a more effective impurity-doping or -introducing method to replace the prior-art method has been desired.

SUMMARY OF THE INVENTION

An object of this invention is to solve the problems of the prior art and to provide a polycrystalline silicon film of low resistivity usable for the interconnections and gate electrodes etc. of various sorts of highly integrated ICs etc. and a method of manufacturing the same.

In order to accomplish the object, this invention uses in combination a hitherto conventional process, such as thermal diffusion, and laser irradiation (laser annealing), thereby to form a polycrystalline silicon film comprising an impurity-doped layer whose impurity concentration is equal to or below a solid solubility, and an impurity-doped layer whose impurity concentration is above the solid solubility.

DETAILED DESCRIPTION OF THE PREFERRED EMBODIMENTS

As stated above, with the hitherto conventional impurity-doping process such as thermal diffusion and ion implantation, it has been difficult to render the resistivity of a polycrystalline silicon film very low.

The cause therefor is that, as already described, the concentration of active impurity atoms determining the value of the resistivity of the polycrystalline silicon film is decided by a thermodynamical solid solubility and has been incapable of being increased.

However, the value of the resistivity can be made smaller than in the prior art in such a way that after a polycrystalline silicon film is implanted with an impurity in large amounts by the ion implantation, it is processed by the so-called laser annealing in which a sample is annealed by irradiating it with a laser beam, not by the conventional annealing which resorts to an electric oven.

The laser annealing has the merits that a required processing time is very short, that only a desired part can be selectively heated without heating any other part appreciably, and so forth.

The laster annealing after implanting the large amounts of impurity ions into the polycrystalline silicon film by ion implantation provides activated impurity atoms at a concentration higher than in the case of performing the conventional annealing with the electric oven.

The reason therefor is not clear, but is conjectured as summarized below.

when the polycrystalline silicon film has reached a high temperature owing to the laser irradiation after the ion implantation, many of the implanted impurity ions enter crystal lattice points. Here, in case of the laser annealing, the rate of cooling from the high temperature down to the room temperature is extraordinarily great. Therefore, the temperature will lower to the room temperature before the release of the impurity atoms from the crystal lattice points, with the result that the number of impurity atoms remaining in the crystal lattice points will increase to raise the concentration of the activated impurity atoms.

However, by doping a polycrystalline silicon film with an impurity and merely subjecting this film to the laser annealing, the resistance value of the film cannot be made sufficiently low in practical use.

Figure 1:
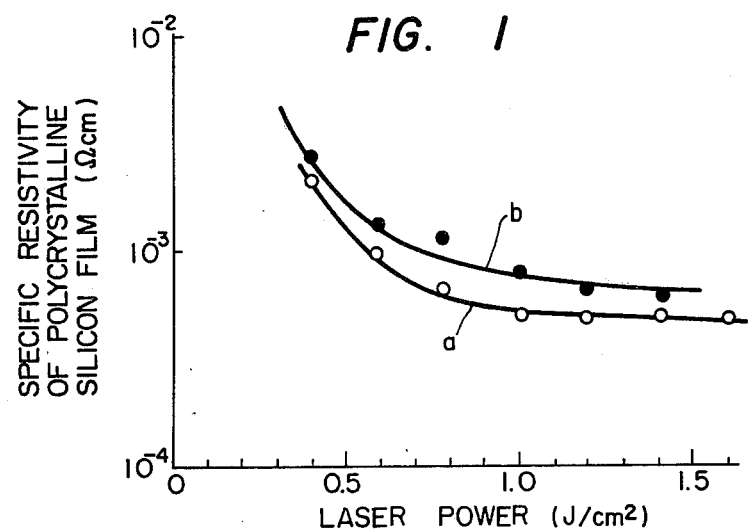
FIG. 1 is a graph showing the relationship between the laser power and the resistivity of a manufactured polycrystalline silicon film in the case where only the laser annealing was carried out.

Curves a and b in FIG. 1 illustrate the relations between the laser energy and the resistivity of an annealed region at the times when samples were implanted with phosphorus and arsenic $3 \times 10^{16}$ cm$^{-2}$ and then subjected to the laser annealing, respectively. In comparison with cases of annealing samples by the ordinary heating, the resistivity becomes approximately ½ in the case of doping with arsenic, whereas the resistivity in the case of doping with phosphorus lowers only 20% or so. This will signify that since the polycrystalline silicon subjected to the laser annealing has a very small crystal grain size and a small ionic mobility, the resistivity does not become very low in spite of a high activated impurity concentration.

In order to anneal a polycrystalline silicon film down to its bottom part by the laser annealing only, the power density of a laser beam for use in the irradiation must be made remarkably high. With this measure, however, the surface part of the film melts, the shape thereof collapses, and the film becomes unusable in actual semiconductor devices. Therefore, an excessive power of the laser beam needs to be avoided.

This invention consists in that the laser annealing, which does not produce a favorable result alone as described above, is combined with annealing employing the electric oven or the like, thereby to form a double-layer film consisting of a first layer which has a very high impurity concentration and which is a surface region and a second layer whose impurity concentration is lower than that of the first layer and which underlies the first layer, thus to form a polycrystalline silicon film which is of lowl resistance as a whole.

Figure 2:
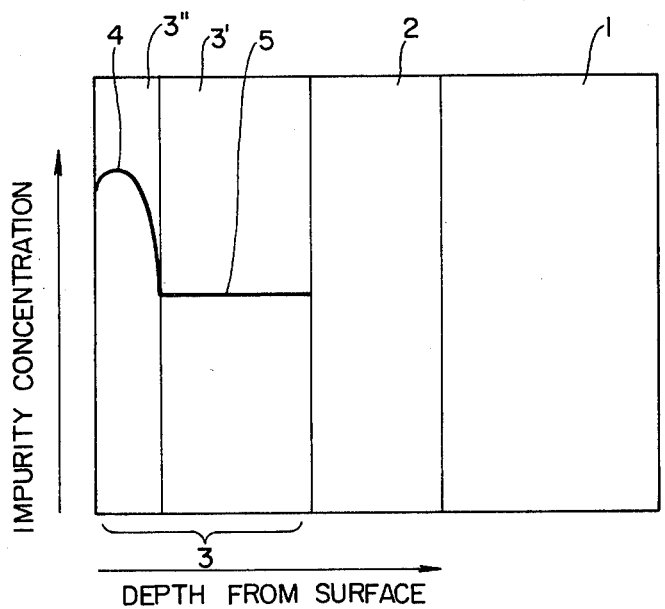
FIG. 2 is a model diagram showing the relationship between the depth from the surface of a polycrystalline silicon film in this invention and the impurity concentration of the polycrystalline silicon film.

FIG. 2 is a model diagram for explaining a polycrystalline silicon film formed in accordance with this invention, and illustrates the relationship between the impurity concentration within a polycrystalline silicon film and the depth from the surface of the film.

A silicon dioxide film 2 and a polycrystalline silicon film 3 are stacked and deposited on a silicon substrate 1.

The polycrystalline silicon film 3 is doped with an impurity by well-known doping means such as the thermal diffusion process and the ion implantation process to form a second layer 3' which has an impurity concentration represented by a straight line 5 in FIG. 2.

As the dopant impurity element in this case, various elements can be selected and used, and phosphorus, arsenic, boron etc. are employed most often. It is a matter of course that the means and conditions of the doping can be appropriately selected and set. For example, when phosphorus was thermally diffused at 1,000° C., the resistivity could be lowered down to approximately $6 \times 10^{-4} \Omega \cdot$cm in a laboratory. In addition, when phosphorus was implanted $3 \times 10^{16}$ cm$^{-2}$ and the annealing was conducted at 1,000° C., the resistivity of the second layer 3' became approximately $4 \times 10^{-4} \Omega \cdot$cm. With the prior-art expedient such as thermal diffusion and ion implantation, it is difficult to render the resistivity of a polycrystalline silicon film lower than these values, and when semiconductor devices are actually mass-produced in a factory, the resistivity increases still more.

Subsequently, the surface region of the polycrystalline silicon film 3 is implanted with an impurity by the ion implantation, whereupon the laser annealing is carried out. Then, a first layer 3" which has an impurity concentration profile represented by a curve 4 in FIG. 2 is formed.

Also in case of forming the first layer 3", various conditions can be appropriately set. By way of example, arsenic is implanted $1 \times 10^{16}$ cm$^{-2}$ at an acceleration voltage of 80 KeV and the film is annealed by irradiating it with a beam of a Q-switched ruby laser.

In this case, the power density of the laser used needs to be made approximately 1.1 J/cm$^2$ or less. When the power density becomes above 1.2 J/cm$^2$, the polycrystalline silicon film is molten and deformed, and hence, it cannot be used for an interconnection or a gate electrode in an actual semiconductor device. On the other hand, when the power density of the laser becomes less than approximately 0.3 J/cm$^2$, the annealing effect is scarcely noted, and a favorable result is not obtained. In forming the first layer in this invention, therefore, a laer beam having a power density of at least approximately 0.3 J/cm$^2$ needs to be projected.

The depth to which the film is annealed by irradiating it with a laser beam at a power density of 1.1 J/cm$^2$, in other words, the thickness of the first layer 3", is approximately 0.2 μm.

The resistivity of the first layer of the polycrystalline silicon film thus formed is approximately $2.5 \times 10^{-4} \Omega \cdot$cm, which is approximately ½ the resistivities attained with the thermal diffusion process etc.

This value is much smaller than the values indicated in FIG. 1. The result in FIG. 1 was obtained in such a way that after the ion implantation, the polycrystalline silicon film was subjected to laser annealing without performing the conventional annealing in advance. With such processing, the grain size of the crystal becomes very small to render the ionic mobility low, so that even when the activated impurity ion concentration is increased by the laser annealing, the resistivity does not become very low.

In contrast, in this invention, when the second layer is thermally annealed after the ion implantation, the first layer is simultaneously annealed thermally and the grain size of the crystal becomes large, and further, the concentration of the activated impurity becomes remarkably high owing to the laser annealing which is performed after completion of the thermal annealing.

It is also allowed that after the thermal annealing, the second ion implantation is performed so as to increase the impurity concentration of the surface region still more, whereupon the laser annealing is carried out. In this case, the processing becomes somewhat complicated, but a very excellent result is obtained.

As understood from the above description, according to this invention, a high mobility and a high activated impurity concentration are achieved at the same time, whereby the value of the resistivity of the first layer becomes much smaller than the values of the resistivities attained by the prior-art method employing only the laser annealing.

The temperature range of the thermal annealing in this invention is approximately 850°–1,200° C. or so. When the annealing temperature is lower than approximately 850° C., the effect of the thermal annealing becomes infinitesimal, whereas when it is higher than approximately 1,200° C., it is feared that the polycrystalline silicon film will be deformed or that a p-n junction etc. formed in a semiconductor body will be adversely affected.

The thickness of a polycrystalline silicon film which is used as an interconnection or a gate electrode in an actual semiconductor device is approximately 0.3 $\mu m$–0.5 $\mu m$ or so. Accordingly, the polycrystalline silicon film to be formed in accordance with this invention is constructed of a first layer containing an impurity above a solid solubility, exhibiting a very low resistivity and being about 0.2 $\mu m$ thick and a second layer having an impurity concentration equal to or below the solid solubility, exhibiting a resistivity somewhat higher than that of the first layer and being about 0.1–0.3 $\mu m$ thick, and its resistivity as a whole becomes a value which is determined by the resistivities and thicknesses of the first and second layers.

Heretofore, a polycrystalline silicon film subjected to the ion implantation has been annealed by only the thermal annealing or the laser annealing.

In case of performing only the laser annealing, as stated previously, the concentration of the activated impurity becomes high, but the resistivity does not become very low on account of the small grain size of the crystal. Moreover, the range in which the polycrystalline silicon film is annealed by the laser annealing extends to approximately 0.2 $\mu m$ in terms of the depth from the surface thereof, and the still lower or deeper part of the film is not annealed at all and remains in a state very close to an insulator. Therefore, the resistivity of the whole polycrystalline silicon film becomes a still greater value.

On the other hand, in case of performing only the thermal annealing, the whole film is annealed, but the lowering of the resistivity is not satisfactory because of the low activated impurity concentration as explained before.

In contrast, according to this invention, the film in the range down to approximately 0.2 $\mu m$ in terms of the depth from the surface has its resistivity rendered very low as described above, and the underlying part thereof is thermally annealed, so that the resistivity of the film produced becomes much lower than in the film obtained by the prior art in which the laser annealing or the thermal annealing is executed alone.

Another advantage of this invention is that, even when a heat treatment is conducted at a later step, the increase in the resistivity attributed thereto is small. More specifically, in case of performing only the laser annealing, there has been the problem that a heat tratment at a later step results in lowering the concentration of the activated impurity and rendering the resistivity conspicuously high. For example, when the laser annealing is followed by a thermal annealing at 400° C. for 30 minutes, the resistivity becomes approximately three times ($1.5 \times 10^{-3} \Omega \cdot cm$) the initial value thereof.

In contrast, when the polycrystalline silicon film thermally annealed in advance is processed by the laser annealing as in this invention, the increase of the resistivity ascribable to a thermal annealing to be performed later is much less. For example, even when the thermal annealing was executed at a step later than the laser annealing, the increase of the resistivity was, at the maximum, as small as approximately 20%, and a polycrystalline silicon film of low resistance could be kept intact.

In the manufacture of actual semiconductor devices, it is often required to perform heat treatments at steps after a polycrystalline silicon film of low resistance has been formed. It is greatly advantageous in practical use that the resistivity is little increased by the heat treatments at such later steps.

What is claimed is:

1. A polycrystalline silicon film comprising a second layer and a first layer formed on the second layer, the second layer being formed by impurity doping and thermal annealing prior to forming the first layer, said second layer having an activated impurity concentration that is not higher than a solid solubility, and the first layer being formed on said second layer and having an activated impurity concentration that is higher than the solid solubility, whereby a polycrystalline film having a low resistivity is formed.

2. A polycrystalline silicon film according to claim 1, wherein thicknesses of said polycrystalline silicon film and said first layer are approximately 0.3–0.5 $\mu m$ and approximately 0.2 $\mu m$, respectively.

3. A polycrystalline silicon film according to claim 1 or 2, wherein resistivities of said first layer and said second layer are approximately $2.5 \times 10^{-4} \Omega \cdot cm$ and approximately $4 \times 10^{-4}$–$6 \times 10^{-4} \Omega \cdot cm$, respectively.

4. A polycrystalline silicon film according to claim 1, 2 or 3, wherein an impurity of said film is an element selected from the group consisting of phosphorus, arsenic and boron.

5. A polycrystalline silicon film according to claim 1, formed by doping an impurity into a polycrystalline silicon film, thermally annealing the polycrystalline silicon film, to form said layer having said activated impurity concentration not higher than a solid solubility, and then irradiating the resultant polycrystalline film with a laser beam to form said first layer on said second layer.

6. A polycrystalline silicon film according to claim 1, formed, after implanting the impurity, by a step of thermal annealing the polycrystalline silicon film to increase the grain size of the crystals of the first layer, so that a high mobility and a high activated impurity concentration are achieved in the polycrystalline silicon film at the same time.

7. A polycrystalline silicon film according to claim 5, wherein the grain size of the crystals of the first layer increases after the thermal annealing.

8. A polycrystalline silicon film according to claim 5 or 7, wherein the activated impurity concentration of said first layer increases after said irradiating with a laser beam.

9. A polycrystalline silicon film according to claim 5, formed, after said thermally annealing but before said irradiating, by a second implanting of an impurity, into the surface region of the polycrystalline silicon film.

10. A polycrystalline silicon film comprising a second layer whose activated impurity concentration is not higher than a solid solubility but whose activated impurity concentration is formed by impurity doping and thermally annealing the second layer to form an activated impurity concentration nearly equal said solid solubility, and a first layer which is formed on said second layer and whose activated impurity concentration is higher than the solid solubility, whereby a polycrystalline film having a low resistivity is formed.

* * * * *